(12) United States Patent
Davlin

(10) Patent No.: US 6,231,925 B1
(45) Date of Patent: May 15, 2001

(54) METHOD FOR ADHERING PRECIOUS METAL TO VITREOUS SUBSTANCES

(76) Inventor: Anthony O. Davlin, 70 Mount Vernon St., Boston, MA (US) 01945

( * ) Notice: Subject to any disclaimer, the term of this patent is extended or adjusted under 35 U.S.C. 154(b) by 0 days.

(21) Appl. No.: 08/997,181

(22) Filed: Dec. 1, 1997

(51) Int. Cl.⁷ .................................................. B05D 3/00
(52) U.S. Cl. ...................... 427/299; 427/314; 427/374.2; 427/376.1; 427/383.5; 427/398.1; 427/399
(58) Field of Search ................. 427/557, 383.5, 427/314, 399, 398.1, 299, 374.2, 376.1

(56) References Cited

U.S. PATENT DOCUMENTS

| | | | |
|---|---|---|---|
| 2,880,552 | * | 4/1959 | Whitehurst ................................ 49/77 |
| 2,950,996 | | 8/1960 | Place, Sr. et al. ................... 117/227 |
| 3,266,912 | | 8/1966 | Murphy ..................................... 106/1 |
| 3,904,782 | * | 9/1975 | Pomerantz ............................. 427/12 |
| 4,401,726 | * | 8/1983 | Gnanamuthu ........................ 427/554 |
| 4,684,446 | * | 8/1987 | Charles et al. ..................... 427/383.5 |
| 4,837,052 | | 6/1989 | Lorimer ................................ 427/160 |
| 5,677,014 | * | 10/1997 | Ohnishi et al. ...................... 427/555 |

* cited by examiner

Primary Examiner—Bernard Pianalto
(74) Attorney, Agent, or Firm—Fish & Richardson P.C.

(57) ABSTRACT

There is provided a method for adhering precious metal to vitreous substances or bodies. Precious metal (including but not limited to, gold, palladium or platinum) is deposited or applied to the surface of the vitreous body. After such initial application, which may include a preheating step, the outer skin or membrane of the glass is made plastic and sticky by superheating. This change in viscosity allows the glass to bond to the deposited precious metal. The superheating process is completed quickly before distortion of the contour of the vitreous object and unwanted vaporization of the deposited metal take place. After the superheating process is completed, the object is annealed conventionally to room temperature.

19 Claims, 1 Drawing Sheet

METHOD FOR ADHERING PRECIOUS METAL TO VITREOUS SUBSTANCES

This invention relates in general to a process for adhering precious metal to vitreous objects, and in particular to a process in which the outer skin of the vitreous object is made plastic and caused to bond to applied precious metal.

BACKGROUND OF THE INVENTION

Precious metal adhesion to glass is involved in a number of industrial and aesthetic applications. Optical and infrared reflectors and lenses can be made to reflect and/or transmit different wavelengths depending upon the particular precious metal film applied. Often such films are also applied in patterns utilizing their ability to conduct electricity. Finally, precious metals, especially gold, have many decorative uses in glass and crystal objects.

U.S. Pat. No. 3,266,912, assigned to Engelhard Corporation, describes a family of products known as "liquid bright golds". These are varnish-like precious metal preparations containing organic compounds combined with flux components which are based on organic metal compounds. The flux components act as an adhesion promoter. On a smooth glass ceramic surface, a high gloss metal film forms after firing in a high temperature oven or annealer. This film has a gold or other precious metal content of 6 to 15%. Such compounds are used in a number of aesthetic and industrial applications in a relatively straightforward application of precious metal to glass. However, the products have some disadvantages. The organic compounds and flux agents essential to such solutions are environmentally toxic. Moreover, the presence of such agents in the fired film or coating compromise the aesthetic and physical properties of such films. The fluxes discolor when applied to certain types of glasses. This causes the color of the precious metal coating to have two tones; depending upon whether one is viewing the film from the surface of the vitreous substrate or through the actual substance the film is applied to. Furthermore, the liquid bright films have a distinct plated look as the gold is formed on the top and not absorbed or melted into the surface of the vitreous substances. From a material efficiency viewpoint, the relatively low precious metal content of such films degrades the electrical, thermal, and optical properties of the films.

U.S. Pat. No. 4,837,052 describes a technology which involves sandwiching a layer of deposited gold between an inner coating of gold-chromium and an outer protective polymer overcoat. In this process, adhesion to the vitreous substrate is achieved through the application first of gold-chromium. Pure gold is then applied to the layer of gold coating but is very complex, requiring three applications. Moreover, successful adhesion is only achieved through the application of a polymer foreign substance.

A third approach to achieving precious metal adhesion is; described in U.S. Pat. No. 2,950,996. This technology involves; combining gold resinates and vitreous substances together in one compound. This mixture is applied to the vitreous surface. Upon firing, the mixture forms a combination gold/vitreous compound which adheres to the vitreous surface as well as to the gold particles suspended in the composition. This technique is effective for many technical applications but also has shortcomings. Particularly, the film is never 100% gold. Moreover, only gold resinates may be used, these compounds limiting the appearance and physical characteristics of the adhered precious metal. Finally, the vitreous substances must have low melting points relative to the glasses they are coated upon, in order that the contour of the coated glass does not distort. Currently, such low melting glasses contain lead. This prevents the use of such coatings in functional glassware.

SUMMARY OF THE INVENTION

The present invention involves the adhesion of precious metal to glass without the use of any foreign material or substances. After the substrate is coated or otherwise contacted with precious metal, the substrate itself is utilized as the means of permanently adhering the precious metal. In particular, the outer or peripheral skin of the coated glass substrate in contact with the metal is superheated to a temperature at which the skin is in a plastic state. A change in viscosity then takes place, allowing a molecular bond to form between the precious metal and the substrate. The superheating phase is accomplished by rapidly applying high-intensity heat to the surface of the precious metal. By conduction through the metal, heat is transmitted to the peripheral surface or skin of the substrate, until lowering of the viscosity of the skin effects adhesion between the metal and the substrate. This superheating process is completed relatively quickly in order to prevent overeating of the entire cross-section of the substrate and resultant change in shape and contour as well as to avoid negatively affecting the state of the precious metal through melting or vaporization.

This process allows precious metal to glass adhesion without additional fluxes or other chemical agents, allowing the formation of a 100% pure coating of precious metal. Gold in any mesh size or composition may be adhered to glass including gold powder, chips, and/or sheets. Moreover, the molecular bond created is quite strong and wear-resistant.

The vitreous substrate may be any one of a variety of substances, including ceramic, quartz, soda-lime qlasses, lead glasses, and boro-silicate and potassium-based glasses. The metal may be any one of several such as gold, silver, platinum, palladium or alloys containing gold, silver, platinum or palladium.

BRIEF DESCRIPTION OF DRAWING

For a better understanding of the invention, reference should be made to the following description of preferred embodiments which should be read in connection with the appended drawings in which.

DESCRIPTION OF THE PREFERRED EMBODIMENTS

Figure 1:
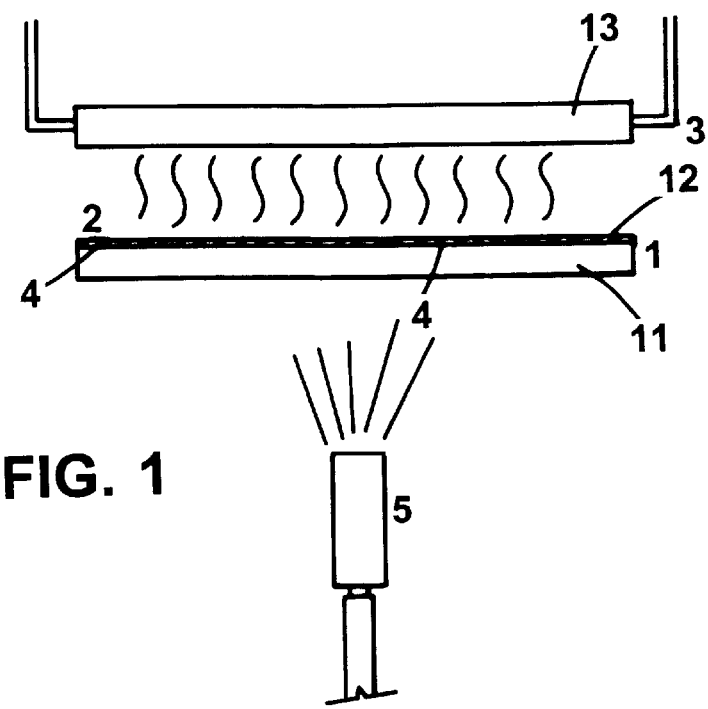
FIG. 1 is a schematic showing of the process of the invention as practiced with a generally flat product.

In the practice of this invention, the chosen precious metal is first placed in contact with a vitreous substance. With a glass substrate, coating may be achieved through conventional vacuum or electrostatic metal deposition, or other techniques known in the art. These techniques may include, for example, placing gold powder within an evaporative substance such as toluene and then brushing or spraying the coating directly a plate. Alternatively, the substrate can be wetted with an evaporative substance such as toluene or methylethylketone and coated with gold leaf or foil.

After the plate is coated, it is preheated in an oven to its annealing point, which may be about 950° F. for soda-lime type glass. Preheating of other glasses, such as lead crystal glasses, which have lower annealing points, is done at lower temperatures.

Still other glasses having higher annealing points are preheated at higher temperatures. This step prepares the glass substrate for the superheating phase. Most glasses will explode and crack if they are superheated directly from room temperature. Successful superheating is enhanced if preceded by a heating to the annealing temperature. On the other hand, thin lead glasses of the order of ⅛" or less in thickness are quite shock-resistant and may be superheated without need for preheating.

Next, the plate is then to within a quarter to a half-inch of a silicon carbide heating element 13 having a watt density of at least 50 watts per inch. Alternatively, heat sources such as quartz infra-red or oxy-gas heating units could be used. Whatever heat source is used, it must have sufficient capacity that superheating of the substrate takes place. Such superheating is defined as heating to a stage at which the body of the substrate remains undistorted but the surface or skin of the substrate becomes plastic and tacky. The skin of the substrate as viewed through the metal has a shiny, continuous appearance when it has reached the stage where it can serve as an adherent by superheating in this fashion. After the superheating phase is completed, the plate is placed within an annealing oven to cool. Glasses with higher melting points may require extended heating phases and possibly higher power densities (depending upon the gauge and type of precious metal and specific melting point of the glass). With a fixed power density, lead glasses will adhere precious metal significantly faster than higher melting point glasses such as a soda-lime type glass.

Alternatively, the heat source may consist of any other high intensity heat creator. In particular, Moly-D resistance elements, quartz infrared heat lamps, and oxy/fuel burner systems all produce power densities needed to change the viscosity of the surface layer of the coated glass. In addition to a high power concentration, the heat source must also be precisely controlled in order to achieve and maintain consistent and thorough adhesion. Temperatures are monitored with the use of optical pyrometers and/or other sensors and power inputs are adjusted in order to achieve this. In the case of electrical power sources, voltage and amperage may be controlled in order to achieve a consistent element temperature. Oxy/fuel systems require precise control of the gas inputs with accurate gas regulators and flow controllers. Thus, any type of heat source with the proper power density may be used. In the case of adhering patterned gold, oxy/gas or other equivalent convective heat source is preferred to an infrared heat source. This is due to the highly reflective or emissive quality of gold. This reflective property can create substantial temperature gradients between uncoated and coated sections; the uncoated areas absorbing most of the infrared spectrum while the coated areas reflecting the same. In this instance, the uncoated substrate may deform excessively before the patterned areas are successfully adhered. Superheating with a convective heat source will prevent this.

Another concern with the described process is the melting temperature of the precious metal. Sustained heating of the precious metal coating can cause the coating to degrade quite rapidly. The temperature of the heat source is typically higher than the melting point of the precious metal. This places an additional constraint on the superheating phase, as prolonged heating will cause the precious metal coating to degrade and ultimately vaporize.

EXAMPLE I

In FIG. 1 of the appended drawing, there is shown a lead-crystal plate 11 having a thickness of about ¼". A layer of gold leaf 12 which may have a thickness of about 0.032" may be adhered by any of the several methods described above, but preferably in this example with the use of an evaporative solvent. The plate 11 is then preheated in an oven to its annealing point of about 840° F.

Following the preheating step, high intensity heat is applied to the surface of the metal layer 12. The heat is generated by a source 13 which has a watt-density of at least 50 watts per inch. This is achieved by placing the metal surface 12 at a point ¼ to ½" from the source 13. Superheating continues until the skin of the plate 11 is liquefied and the glass becomes shiny in appearance as viewed through the metal layer. This may occur when the melting point of the lead crystal glass is reached and should not be maintained long enough for the entire plate to soften and lose its contours. Also, the superheating phase should be discontinued before degradation of the metal coating occurs. The rate of such distorting of the substrate and degradation of the metal coating may be reduced by directing a stream of cooling air upon the uncoated lower surface of the substrate 11 from a source 15.

EXAMPLE II

Figure 2:
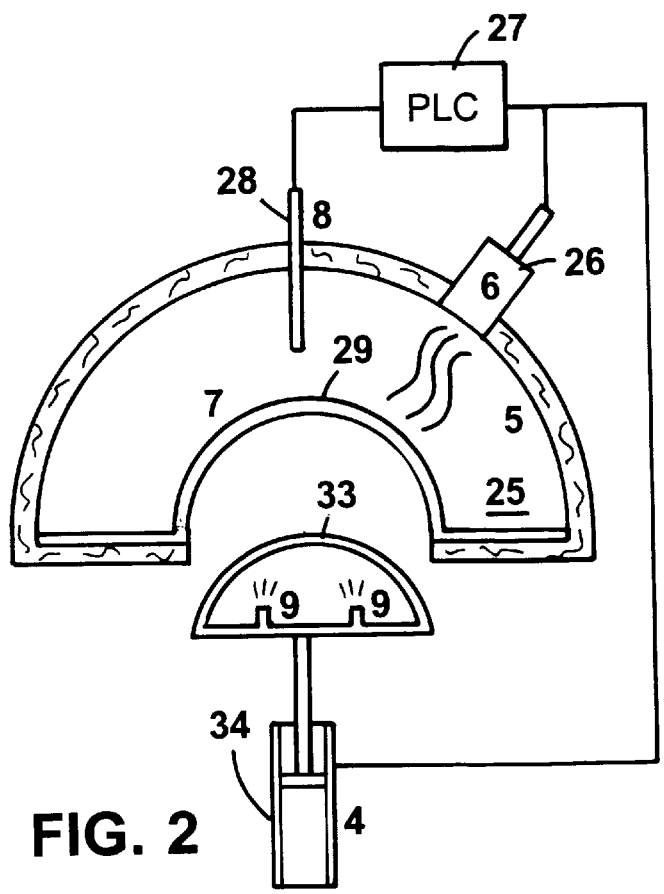
FIG. 2 is a schematic illustrating the invention as used with a curved surface.

Precious metal may be adhered to a curved surface of a vitreous body in accordance with the invention in the following manner as shown in FIG. 2. A high temperature furnace 25 is heated by a high-intensity heat source having the approximate shape and contour of the object 33 being coated with precious metal. The heat source may be any one of those previously mentioned such as curved electrical elements or an oxy-gas burner configured in a curved shape as at source 26 on a high-temperature furnace 26. The source 26 is controlled by a controller 27 which receives feedback from a thermocouple 28. The floor 29 of the furnace may be constituted by a highly conductive shell case, preferably from sintered silicon carbide. The silicon carbide may be cast in any shape to match that of the object 33 being coated. As in the embodiment of FIG. 1, cooling air may be provided from a source 35 beneath the substrate of the object 33 to prevent thin substrates from distorting. The object 33 may be lifted by a pneumatic lifter 34 to within a ¼" of the floor shell 29. The object 33 is held in such proximity to the shell 29 briefly to superheat and melt the skin of the substrate immediately adjacent to the layer of precious metal only until the metal coating becomes shiny to reveal its plastic and viscous adherent state.

What is claimed is:

1. A process for adhering precious metal to a vitreous substrate comprising:

applying a precious metal to a surface of said substrate;

after applying the precious metal to the substrate, preheating said substrate and said metal to a first temperature that is below the softening point of said substrate; and while the substrate is at the first temperature, applying intense heat to the surface of said substrate to raise the temperature of only the skin of said vitreous substrate to above its softening point, so as to effect a bond between said precious metal and said substrate while preventing distortion of said vitreous substrate and vaporization of said precious metal.

2. The process of claim 1 wherein the first temperature is near the annealing point of said substrate.

3. The process of claim 1, further comprising the step of cooling said substrate simultaneously or immediately after the application of intense heat.

4. The process of claim 1, wherein said vitreous substrate is a soda-lime based glass.

5. The process of claim 1, wherein said vitreous substrate is a lead-based glass.

6. The process of claim 1, wherein said vitreous substrate is a borosilicate-based glass.

7. The process of claim 1, wherein said vitreous substrate is a potassium-based glass.

8. The process of claim 1, wherein said precious metal is comprised of gold.

9. The process of claim 1, wherein said precious metal is comprised of platinum.

10. The process of claim 1, wherein said precious metal is comprised of palladium.

11. The process of claim 1, wherein said precious metal is comprised of silver.

12. The process of claim 1, wherein said precious metal is comprised of an alloy containing gold, platinum, palladium, or silver.

13. The process of claim 1 wherein the first temperature is above the annealing point of said substrate.

14. The process of claim 1 wherein the preheating of the substrate is performed relatively slowly.

15. The process of claim 1 wherein the step of applying intense heat involves rapidly superheating the skin of said vitreous substrate.

16. The process of claim 1 wherein the step of applying intense heat is completed quickly to prevent overheating of the entire cross-section of the substrate.

17. The process of claim 1 further comprising wetting the surface of the substrate before applying the precious metal, and wherein the applying step comprises applying the precious metal to the wetted surface of the substrate.

18. The process of claim 17 wherein the wetting step comprises wetting the surface with an evaporative solvent.

19. The process of claim 1 further comprising cooling a backside of the substrate during the intense heating step.

* * * * *